(12) United States Patent
Xian et al.

(10) Patent No.: US 10,629,635 B2
(45) Date of Patent: Apr. 21, 2020

(54) ARRAY SUBSTRATE AND DISPLAY DEVICE (71) Applicant: BOE TECHNOLOGY GROUP CO., LTD., Beijing (CN)

(72) Inventors: Jianbo Xian, Beijing (CN); Pan Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/512,429

(22) PCT Filed: Sep. 2, 2016

(86) PCT No.: PCT/CN2016/097843
§ 371 (c)(1),
(2) Date: Mar. 17, 2017

(87) PCT Pub. No.: WO2017/113864
PCT Pub. Date: Jul. 6, 2017

(65) Prior Publication Data
US 2018/0294288 A1 Oct. 11, 2018

(30) Foreign Application Priority Data
Dec. 30, 2015 (CN) .................... 2015 2 1130267 U (51) Int. Cl.
*H01L 27/12* (2006.01)
*G09G 3/20* (2006.01)
(Continued)

(52) U.S. Cl.
CPC ........ *H01L 27/1244* (2013.01); *G02F 1/1345* (2013.01); *G02F 1/13458* (2013.01);
(Continued)

(58) Field of Classification Search
CPC . H01L 27/1244; H01L 27/0296; H01L 22/32; H01L 23/4985; G02F 1/1345
(Continued)

(56) References Cited

U.S. PATENT DOCUMENTS 5,971,771 A * 10/1999 Faragi .................... H05K 3/325
439/66
2002/0037600 A1* 3/2002 Hirabayshi ....... H01L 31/02164
438/30
(Continued)

FOREIGN PATENT DOCUMENTS

CN          1523409 A    8/2004
CN        101122695 A    2/2008
(Continued)

OTHER PUBLICATIONS

International Search Report and Written Opinion for Application No. PCT/CN2016/097843 dated Nov. 28, 2016, 14 Pages.

*Primary Examiner* — Thinh T Nguyen
(74) *Attorney, Agent, or Firm* — Brooks Kushman P.C.

(57) ABSTRACT

An array substrate and a display device are provided. The array substrate includes a display region and a non-display region surrounding the display region. The non-display region includes a connection region where a plurality of connection pads is arranged, and for at least parts of the connection pads, two adjacent connection pads are not overlap each other or partially overlap each other in a first direction.

18 Claims, 10 Drawing Sheets (51) Int. Cl.
*G02F 1/1345* (2006.01)
*H01L 27/02* (2006.01)

(52) U.S. Cl.
CPC ............ *G09G 3/20* (2013.01); *H01L 27/0296* (2013.01); *H01L 27/124* (2013.01)

(58) Field of Classification Search
USPC ................. 257/72, 79, 59; 438/48, 128, 149
See application file for complete search history.

(56) References Cited

U.S. PATENT DOCUMENTS

| | | |
|---|---|---|
| 2002/0105263 A1* | 8/2002 | Kim ...................... G02F 1/1435 349/149 |
| 2003/0095219 A1* | 5/2003 | Lee ................... G02F 1/133512 349/110 |
| 2007/0188693 A1 | 8/2007 | Hwang et al. |
| 2009/0033823 A1 | 2/2009 | Chung et al. |
| 2012/0006584 A1 | 1/2012 | Matsui et al. |
| 2012/0025372 A1 | 2/2012 | Tang et al. |
| 2015/0108436 A1* | 4/2015 | Min et al. ........... H01L 27/3246 |
| 2015/0226995 A1 | 8/2015 | Aota |

FOREIGN PATENT DOCUMENTS

| | | |
|---|---|---|
| CN | 101644838 A | 2/2010 |
| CN | 101779526 A | 7/2010 |
| CN | 205264316 U | 5/2016 |
| WO | 2014034102 A1 | 3/2014 |

\* cited by examiner

ARRAY SUBSTRATE AND DISPLAY DEVICE

CROSS-REFERENCE TO RELATED APPLICATIONS

This application is the U.S. national phase of PCT Application No. PCT/CN2016/097843 filed on Sep. 2, 2016, which claims priority to Chinese Patent Application No. 201521130267.9 filed on Dec. 30, 2015, the disclosures of which are incorporated in their entirety by reference herein.

TECHNICAL FIELD

The present disclosure relates to the field of display technology, in particular to an array substrate and a display device.

BACKGROUND

For a display device, it may display an image through an electrical signal applied to signal lines at a display region, and the signal lines are connected to an external device through connection pads. Usually, the connection pads are arranged in a line and parallel to a lateral edge of an array substrate. In order to reduce an arrangement space, a relatively small gap is provided between the adjacent connection pads. However, at this time, the connection pads may easily be broken down by static electricity.

SUMMARY

An object of the present disclosure is to provide an array substrate and a display device, so as to prevent the connection pads from being broken down by the static electricity due to the small gap between the adjacent connection pads.

In one aspect, the present disclosure provides in some embodiments an array substrate, including a display region and a non-display region. The non-display region includes a connection region where a plurality of connection pads is arranged, and for at least parts of the connection pads, two adjacent connection pads are not overlap each other or partially overlap each other in a first direction.

In a possible embodiment of the present disclosure, a part of the connection pads fully overlap each other in the first direction.

In a possible embodiment of the present disclosure, the odd-numbered connection pads in the first direction fully overlap each other, and the even-numbered connection pads in the first direction fully overlap each other.

In a possible embodiment of the present disclosure, in the case that the two adjacent connection pads are not overlap each other in the first direction, the two adjacent connection pads partially overlap each other in a second direction perpendicular to the first direction.

In a possible embodiment of the present disclosure, the array substrate further includes an antistatic mechanism arranged at a non-wiring region between the two adjacent odd-numbered connection pads or the two adjacent even-numbered connection pads.

In a possible embodiment, the array substrate further includes an alignment mark arranged at the non-wiring region between the two adjacent odd-numbered connection pads or the two adjacent even-numbered connection pads.

In a possible embodiment, the array substrate further includes a testing mechanism arranged at the non-wiring region between the two adjacent odd-numbered connection pads or the two adjacent even-numbered connection pads.

In a possible embodiment of the present disclosure, in the case that the two adjacent connection pads partially overlaps each other in the first direction to form a first overlapping region, a width of the first overlapping region is one-fifth to one-third of a length of a first connection pad, and the length of the first connection pad is a distance between two opposite lateral sides of the first connection pad in a second direction perpendicular to the first direction.

In a possible embodiment of the present disclosure, the array substrate further includes signal lines arranged at the display region and leads arranged at the non-display region, and each lead is arranged to apply an electrical signal to a corresponding signal line via the connection pad. Each connection pad includes a plurality of film patterns arranged at different layers and electrically connected to each other.

In a possible embodiment of the present disclosure, the leads include a first lead and a second lead intersecting each other, and the first lead is insulated from the second lead at an intersection.

In a possible embodiment of the present disclosure, the first lead includes a hollowed-out portion at the intersection.

In a possible embodiment of the present disclosure, the array substrate is a thin film transistor (TFT) array substrate, and the signal lines include a first signal line and a second signal line which are both gate lines or both data lines.

In a possible embodiment of the present disclosure, the first signal line is a gate line and the second signal line is a common signal line.

In a possible embodiment of the present disclosure, the first signal line is a gate line or a data line and the second signal line is a common signal line.

In a possible embodiment of the present disclosure, each connection pad includes a pattern of a gate metal layer and a pattern of a source-drain metal layer.

In a possible embodiment of the present disclosure, the first direction is parallel to an extension direction of the signal line.

In a possible embodiment of the present disclosure, the connection region includes a first connection region and a second connection region, the connection pads at the first connection region are electrically connected to the signal lines in odd-numbered rows, and the connection pads at the second connection region are electrically connected to the signal lines in the even-numbered rows.

In a possible embodiment of the present disclosure, the non-display region further includes a sealant region, and the connection region is arranged between the display region and the sealant region.

In a possible embodiment of the present disclosure, all the connection pads are of an identical shape and an identical size.

In a possible embodiment of the present disclosure, a cross section of each connection pad is of a square shape in a direction parallel to a plane where the array substrate is located.

In another aspect, the present disclosure provides in some embodiments a display device including the above-mentioned array substrate.

According to the embodiments of the present disclosure, the connection pads for the leads and the signal lines are arranged at the non-display region of the array substrate, and for at least parts of the connection pads, two adjacent connection pads are not overlap each other or partially overlap each other in the first direction. As a result, it is able to prevent the connection pads from being broken down by static electricity even in the case that a very small gap is provided between the two adjacent connection pads in the second direction perpendicular to the first direction.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

Figure 1:
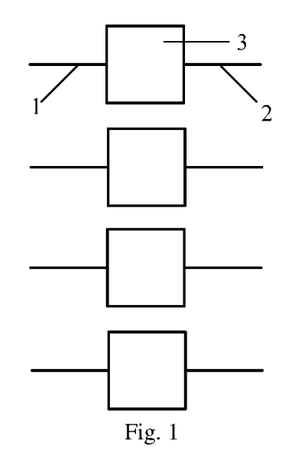
FIG. 1 is a schematic view showing the arrangement of connection pads of a conventional array substrate.

As shown in FIG. 1, usually signal lines 1 at a display region may extend from the display region toward a non-display region, and leads 2 and connection pads 3 may be arranged at the non-display region. One end of each lead 3 may be connected to a control circuit, and another end thereof may be configured to apply an electrical signal to a corresponding signal line 1 via the connection pad 3. In FIG. 1, the connection pads 3 are arranged in a line in a second detection perpendicular to a first direction (in which the signal lines 1 and the leads 2 extend).

The present disclosure provides in some embodiments an array substrate and a display device including the array substrate. The array substrate includes a display region and a non-display region surrounding the display region. The non-display region includes a connection region where a plurality of connection pads is arranged, and for at least parts of the connection pads, two adjacent connection pads are not overlap each other or partially overlap each other in a first direction. In this way, it is able to prevent the connection pads from being broken down by static electricity even in the case that a very small gap is provided between the two adjacent connection pads in a second direction perpendicular to the first direction. A line extending in the first direction and a plane where the connection pads are located are parallel to a plane where the array substrate is located.

In addition, it is able to increase an area of a region surrounding the connection pad, thereby to make full use of this region. Further, through the very small gap provided between the two adjacent connection pads in the second direction, it is able to provide the display device with a narrow bezel.

It should be appreciated that, "any two adjacent to connection pads are not overlap each other or partially overlap each other in the first direction" refers to that orthogonal projections of the two adjacent connection pads onto a first plane do not overlap each other or partially overlap each other, and the first plane is parallel to the first direction and perpendicular to the plane where the array substrate is located.

In a possible embodiment of the present disclosure, parts of the connection pads fully overlap each other in the first direction, so as to reduce a coverage width of all connection pads in the first direction, thereby to provide a narrow bezel.

The array substrate further includes signal lines arranged at the display region and leads arranged at the non-display region. One end of each lead is connected to a control circuit, and another end thereof is configured to apply an electrical signal to the corresponding signal line via the connection pad, so as to display an image. Taking a TFT array substrate as an example, the signal lines include one or more kinds of gate lines, data lines and common signal lines. The control circuit includes one or more of a gate scanning and driving circuit, a data driving circuit and a ground pin.

The present disclosure will be described hereinafter in conjunction with the drawings and embodiments. The following embodiments are for illustrative purposes only, but shall not be used to limit the present disclosure.

For ease of understanding, in the embodiments of the present disclosure, the connection pads in odd numbers are called as first connection pads, and the connection pads in even numbers are called as second connection pads. The first direction and the second direction are shown in the drawings.

Figure 2:
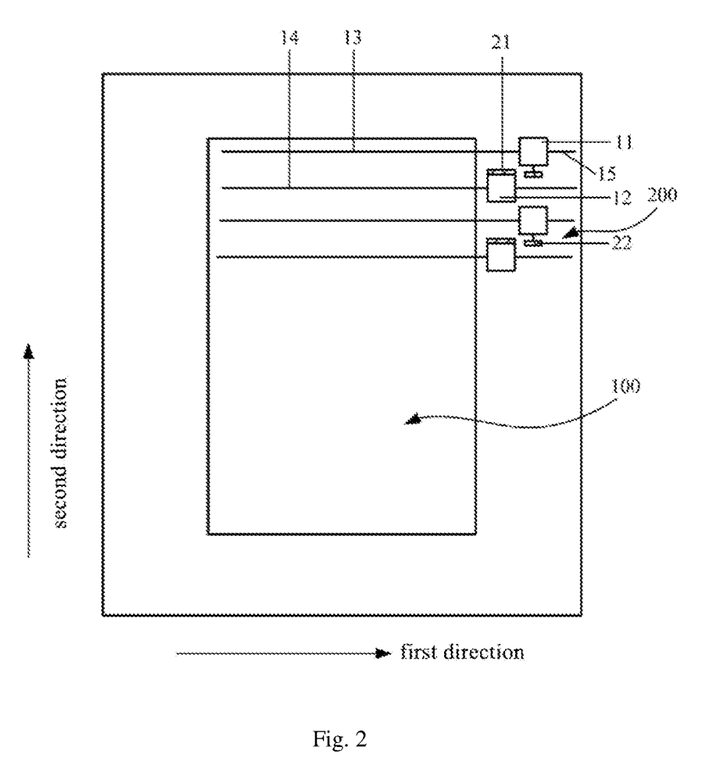
FIG. 2 is a schematic view showing the arrangement of connection pads of an array substrate according to at least one embodiment of the present disclosure.

As shown in FIG. 2, the array substrate includes a display region 100 and a non-display region 200 surrounding the display region 100. The non-display region includes a connection region where the first connection pads 11 and the second connection pads 12 are arranged alternately. For example, one second connection pad 12 may be arranged between two adjacent first connection pads 11, and one first connection pad 11 may be arranged between two adjacent second connection pads 12.

For at least parts of the connection pads, each first connection pad 11 is not overlap, or partially overlaps, the adjacent second connection pad 12 in the first direction. In this way, it is able to prevent the connection pads from being easily broken down by static electricity even in the case that a very small gap is provided between the first connection pad 11 and the second connection pad 12 adjacent to each other in a second direction perpendicular to the first direction. In addition, it is able to increase an area of a region surrounding each connection pad and make full use of this region, thereby to provide a narrow bezel.

In addition, in the embodiments of the present disclosure, it is able to make full use of the non-display region in the following ways so as to provide the narrow bezel. For example, for at least parts of the connection pads, each first connection pad 11 may be not overlap, or partially overlap, the adjacent second connection pad 12, and meanwhile, one or more of such structures as an alignment mark 21, an antistatic mechanism 22 and a testing mechanism may also arranged at the non-display region of the array substrate.

As shown in FIG. 2, because each first connection pad 11 is not overlap, or partially overlaps, the adjacent second connection pad 12 in the first direction, it is able to increase an area of a non-wiring region 200 surrounding each connection pad. The above-mentioned structures may be arranged at the region surrounding the connection pad, so as to make full use of this region. As a result, it is unnecessary to form the above-mentioned structure at an additional region of the array substrate in the first direction, thereby to provide the narrow bezel.

All the connection pads of the array substrate may be of an identical shape and an identical size, or different shapes and different sizes. In the embodiments of the present disclosure, all the connection pads of the array substrate are of an identical shape and an identical size, and a cross section of each connection pad is of a square shape in a direction parallel to the plane where the array substrate is located.

The array substrate further includes signal lines 100 arranged at the display region 100 and a first lead 15 arranged at the non-display region. The first lead 15 is configured to apply an electrical signal to the corresponding signal line via the connection pad. As shown in FIGS. 13-17, for the TFT array substrate, the signal lines include one or more kinds of gate lines, data lines and common signal lines. The first direction is parallel to an extension direction of the signal lines.

For ease of understanding, the signal lines in odd-numbered rows are first signal lines 13, and the signal lines in even-numbered rows are second signal lines. Each first connection pad 11 is connected to the corresponding first signal line 13, and each second connection pad 12 is connected to the corresponding second signal line 14.

Figure 14:
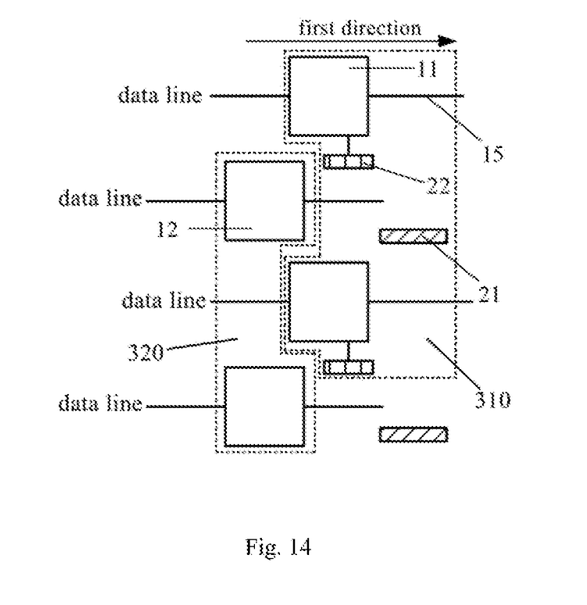
FIG. 14 is still yet another schematic view showing the arrangement of the connection pads of the array substrate according to at least one embodiment of the present disclosure.
Figure 15:
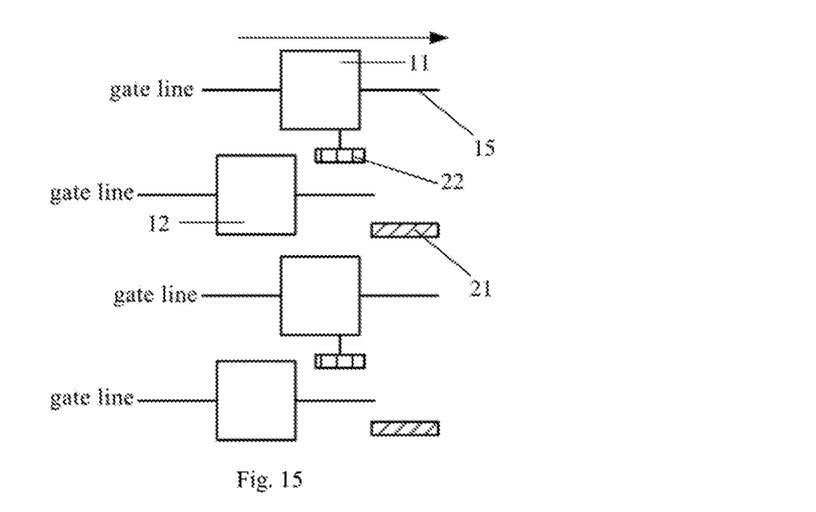
FIG. 15 is still yet another schematic view showing the arrangement of the connection pads of the array substrate according to at least one embodiment of the present disclosure.
Figure 16:
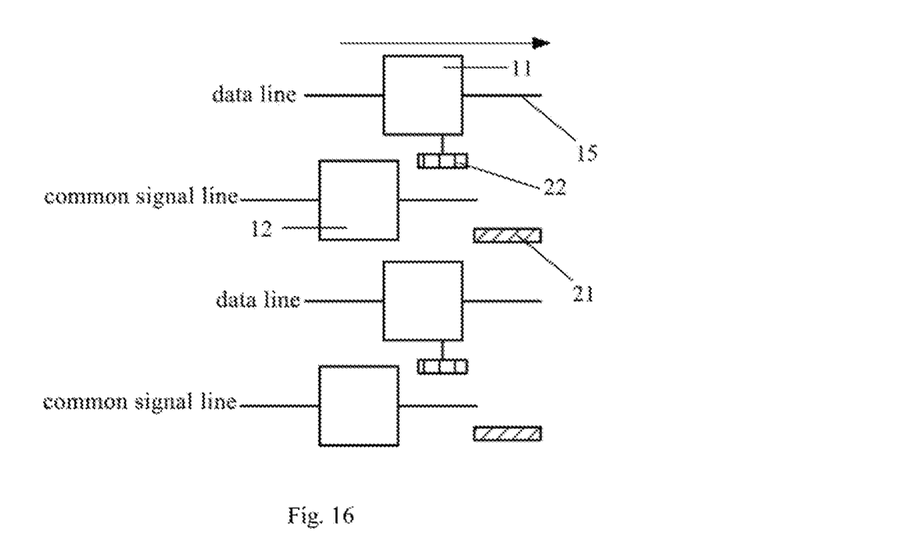
FIG. 16 is still yet another schematic view showing the arrangement of the connection pads of the array substrate according to at least one embodiment of the present disclosure.
Figure 17:
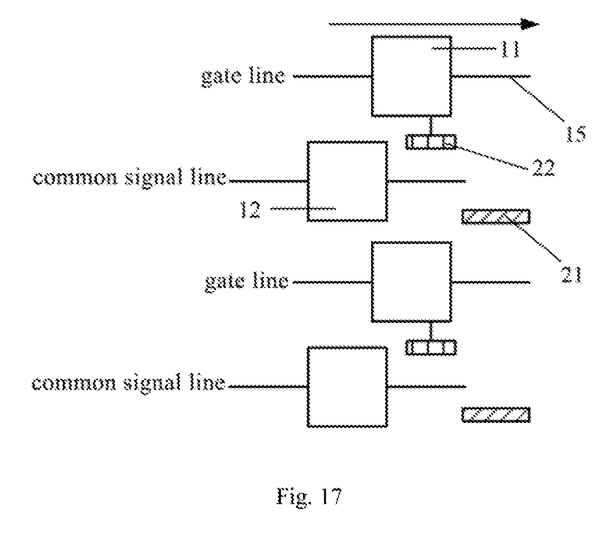
FIG. 17 is still yet another schematic view showing the arrangement of the connection pads of the array substrate according to at least one embodiment of the present disclosure.

Further, as shown in FIG. 14, the connection region includes a first connection region 310 and a second connection region 320. The first connection pads 11 are arranged at the first connection region, and each of them is connected to the corresponding first signal line 13. The second connection pads 12 are arranged at the second connection region, and each of them is connected to the corresponding second signal line 14. In this way, it able to control the signal lines in the odd-numbered rows and the even-numbered rows separately, thereby to control the display in a flexible manner.

Figure 3:
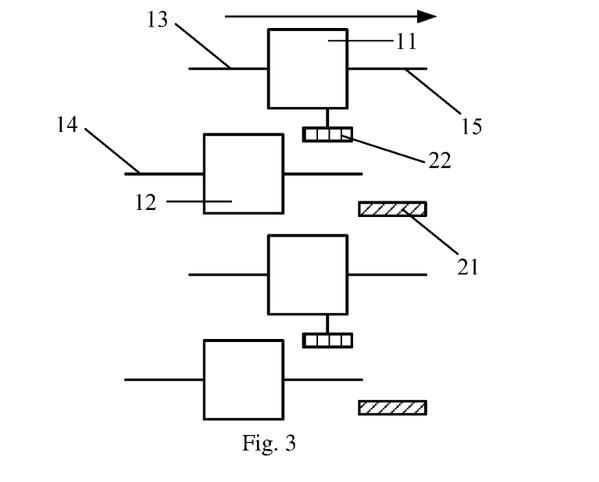
FIG. 3 is another schematic view showing the arrangement of the connection pads of the array substrate according to at least one embodiment of the present disclosure.
Figure 4:
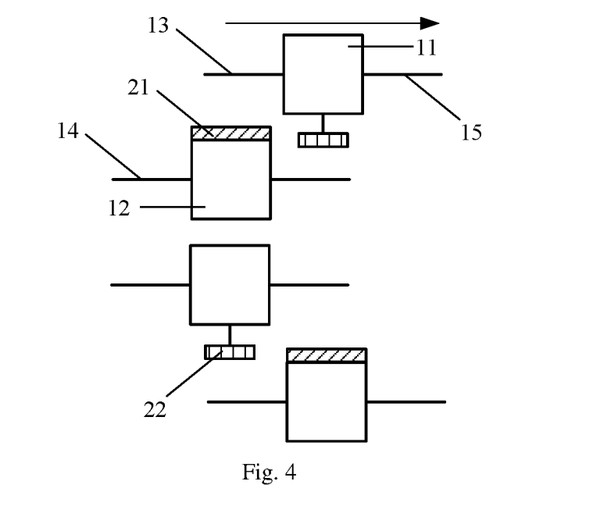
FIG. 4 is yet another schematic view showing the arrangement of the connection pads of the array substrate according to at least one embodiment of the present disclosure.
Figure 5:
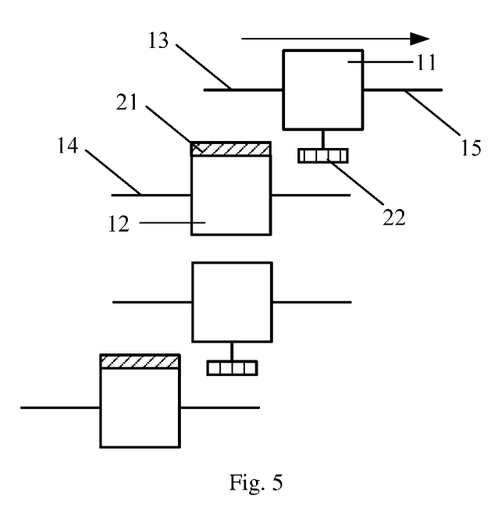
FIG. 5 is still yet another schematic view showing the arrangement of the connection pads of the array substrate according to at least one embodiment of the present disclosure.
Figure 6:
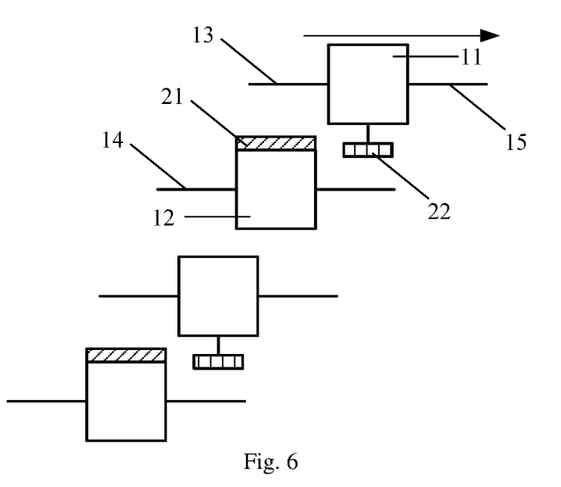
FIG. 6 is still yet another schematic view showing the arrangement of the connection pads of the array substrate according to at least one embodiment of the present disclosure.

Because each first connection pad 11 is not overlap, or partially overlaps, the adjacent second connection pad 12 in the first direction, a coverage width of connection pads may increase in the first direction. In the embodiments of the present disclosure, parts of the first connection pads 11 fully overlap each other in the first direction (as shown in FIGS. 2 and 3), or parts of the second connection pads 12 fully overlap each other in the first direction (as shown in FIGS. 2 and 3), or parts of the first connection pads 11 and the second connection pads 12 fully overlap each other in the first direction (as shown in FIGS. 4 and 5). In this way, it is able to reduce the coverage width of all connection pads in the first direction, thereby to provide the narrow bezel. It should be appreciated that, all the connection pads may also not fully overlap each other in the first direction, as shown in FIG. 6.

In a possible embodiment of the present disclosure, all the first connection pads 11 fully overlap each other in the first direction, and all the second connection pads 12 fully overlap each other in the first direction, so as to minimize the coverage width of all connection pad in the first direction. In addition, because each first connection pad 11 is not overlap, or partially overlaps, the adjacent second connection pad 12, an overlapping area between the two adjacent first connection pads 11 and an overlapping area between the two adjacent second connection pads 12 may increase. As a result, it is able to make full use of the regions surrounding the first connection pads 11 and the second connection pads 12, thereby to provide the display device with the narrow bezel.

In a possible embodiment of the present disclosure, one or more of such structures as the alignment mark 21, the antistatic mechanism and the testing mechanism may be arranged at the non-wiring region 200 between the two adjacent first connection pads 11 and/or between the two adjacent second connection pads 12, so as to make full use of the regions surrounding the connection pads, thereby to provide the narrow bezel.

In order to ensure a sufficient large area of the non-wiring region 200 surrounding the connection pads, thereby to form such structures as the alignment mark 21, the antistatic mechanism 22 and the testing structure at the non-wiring region, in the case that each first connection pad 11 partially overlaps the adjacent second connection pad 12 in the first direction, an area of an overlapping portion shall not be too large. Hence, in the embodiments of the present disclosure, in the case that each first connection pad 12 partially overlaps the adjacent second connection pad 12 in the first direction to form a first overlapping region, a width of the first overlapping region may be one-fifth to one-third of a length of each first connection pad. The length of each first connection pad 11 is a distance between two lateral sides of the first connection pad 11 in a second direction perpendicular to the first direction.

For the array substrate, the first signal lines 13 and the second signal lines 14 extend from the display region toward the connection region of the non-display region, and then are electrically connected to the connection pads respectively.

In a possible embodiment of the present disclosure, the non-display region further includes a sealant region (not shown), and the connection region is arranged between the display region and the sealant region. One end of the first lead 15 at the non-display region is connected to a control circuit, and another end thereof is connected to the connection pad, so as to apply an electrical signal for controlling the display to the first signal lines 13 and the second signal lines 14 via the connection pads.

In a possible embodiment of the present disclosure, each connection pad (each first connection pad 11 or each second connection pad 12) includes a plurality of film patterns arranged at different layers and electrically connected to each other, so as to ensure the reliability of the electrical transmission. In the case that each connection pad includes a first pattern arranged at a layer different from the signal line and the first lead 15, an insulation layer may be arranged between the first pattern and the signal line as well as the first lead 15. The first pattern is electrically connected to the signal line and the first lead 15 through a via-hole in the insulation layer.

Figure 7:
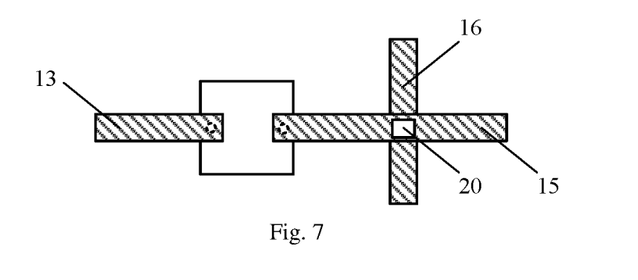
FIG. 7 is a partial schematic view showing the array substrate according to at least one embodiment of the present disclosure.
Figure 8:
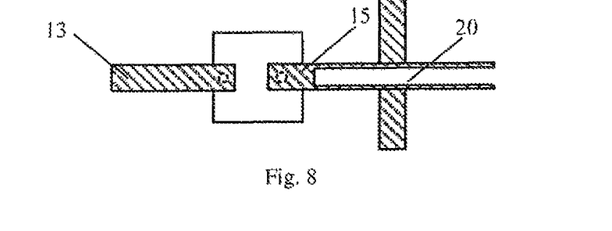
FIG. 8 is another partial schematic view showing the array substrate according to at least one embodiment of the present disclosure.

In the embodiments of the present disclosure, as shown in FIGS. 7 and 8, in the case that the non-display region of the array substrate includes a second lead 16 insulated from and intersecting the first lead 15, the first lead 15 may include a hollowed-out portion 20 at an intersection, so as to reduce a parasitic capacitance generated between the first lead 15 and the second lead 16.

The present disclosure will be described hereinafter in more details by taking the TFT array substrate as an example.

For the TFT array substrate, the signal lines at its display region include gate lines, data lines and common signal lines. The gate lines and the data lines cross each other to define a plurality of pixel regions. A TFT and a pixel electrode are arranged at each pixel region, and the pixel electrode is electrically connected to a drain electrode of the TFT. Each gate line is electrically connected to a gate electrode of the TFT, and a gate scanning signal is applied by a gate scanning and driving circuit at the non-display region to the gate line via a gate lead, so as to turn on the TFTs in each row. Each data line is electrically connected to a source electrode of the TFT, and a pixel voltage signal is applied by a data driving circuit at the non-display region to the data line through a data lead. The pixel voltage signal is applied to the pixel electrode through the TFT, so as to display an image. The common signal line is connected to a ground pin at the non-display region via a common signal lead, so as to apply a reference voltage to the pixel region.

In the embodiments of the present disclosure, the first signal line 13 and the second signal line 14 may be both gate lines or data lines of the TFT array substrate. In a possible embodiment of the present disclosure, the first signal line 13 may be a gate line while the second signal line 14 may be a common signal line, or the first signal line 13 may be a data line while the second signal line 14 may be a common signal line. The first signal line 13 may be electrically connected to one of the first connection pads 11, and the second signal line 14 may be electrically connected to one of the second connection pads 12.

Each of the first connection pads 11 and the second connection pads 12 may include a pattern of a gate metal layer and a pattern of a source-drain metal layer, and the gate metal layer may be electrically connected to the source-drain metal layer through a transparent conductive layer. In the case that the first signal line 13 is a gate line, the first signal line 13 is arranged at a layer different from the pattern of the source-drain metal layer of the first connection pad 13, and the first signal line 13 is electrically connected to the source-drain metal layer of the first connection pad 11 through a via-hole in an insulation layer between the first signal line 13 and the source-drain metal layer. In the case that the first signal line 13 is a data line, the first signal line 13 is arranged at a layer different from the pattern of the gate metal layer of the first connection pad 11, and the first signal line 13 is electrically connected to the gate metal layer of the first connection pad 11 through a via-hole in an insulation layer between the first signal line 13 and the gate metal layer. A connection mode between the second signal line 14 and the second connection pad 12 is similar to a connection mode between the first signal line 13 and the first connection pad 11, and thus will not be particularly defined herein.

In the embodiments of the present disclosure, for at least parts of the connection pads of the array substrate, each first connection pad 11 is arranged adjacent to one second connection pad 12. The first connection pads 11 refer to the connection pads in odd numbers, and the second connection pads 12 refer to the connection pads in even numbers. In addition, for at least parts of the connection pads, each first connection pad 11 is not overlap, or partially overlaps, the adjacent second connection pad 12 in the first direction, so as to make full use of the region surrounding the connection pads, thereby to narrow the bezel at a first lateral side of the array substrate in the first direction. Based on the above, it is also able to further narrow the bezel at a second lateral side of the array substrate adjacent to the first lateral side.

Figure 9:
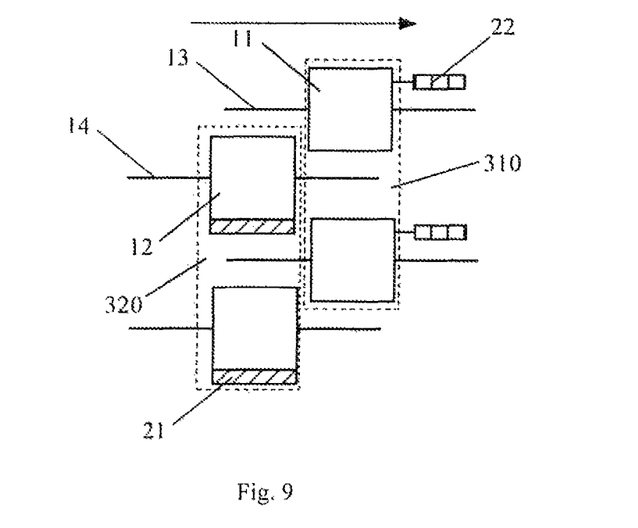
FIG. 9 is still yet another schematic view showing the arrangement of the connection pads of the array substrate according to at least one embodiment of the present disclosure.
Figure 10:
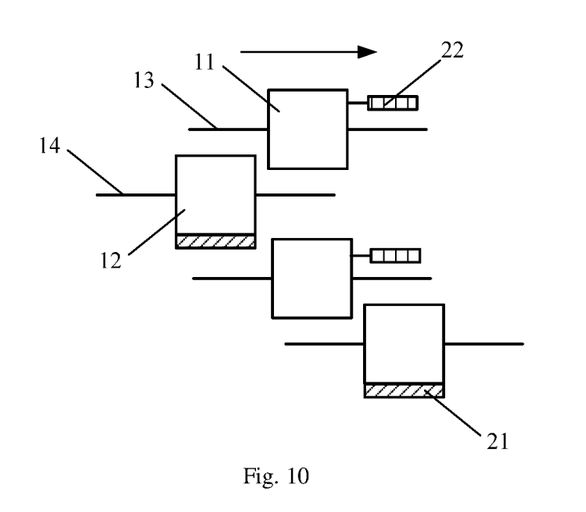
FIG. 10 is still yet another schematic view showing the arrangement of the connection pads of the array substrate according to at least one embodiment of the present disclosure.

In order to achieve the above-mentioned objects, as shown in FIGS. 9 and 10, in the case that each first connection pad 11 is not overlap the adjacent second connection pad 12 in the first direction, the first connection pad 11 and the adjacent second connection pad 12 may partially overlap in the second direction perpendicular to the first direction, so as to narrow the bezel at the first lateral side and the second lateral side of the array substrate simultaneously.

Figure 11:
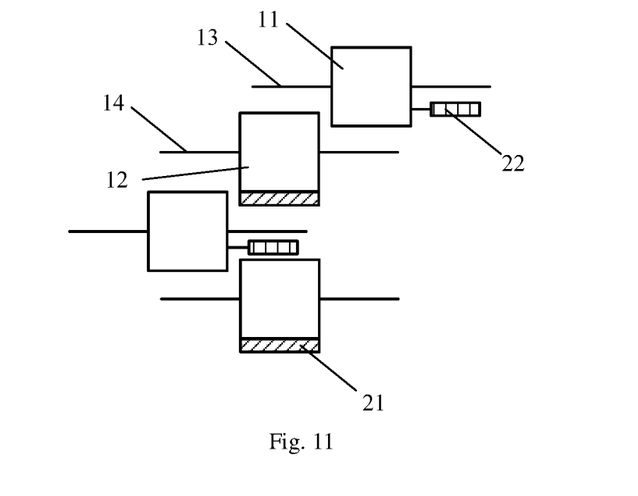
FIG. 11 is still yet another schematic view showing the arrangement of the connection pads of the array substrate according to at least one embodiment of the present disclosure.
Figure 12:
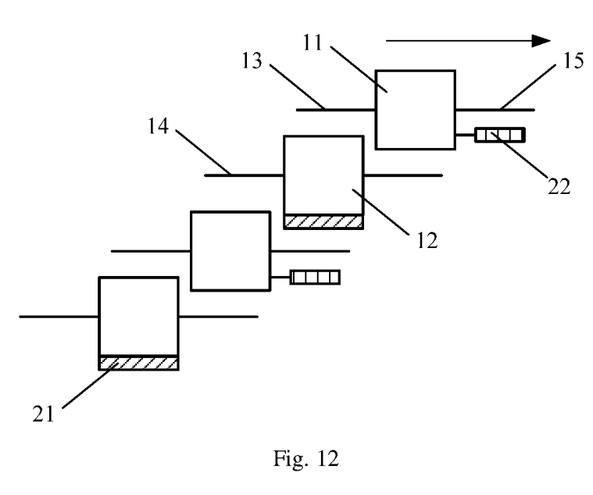
FIG. 12 is still yet another schematic view showing the arrangement of the connection pads of the array substrate according to at least one embodiment of the present disclosure.
Figure 13:
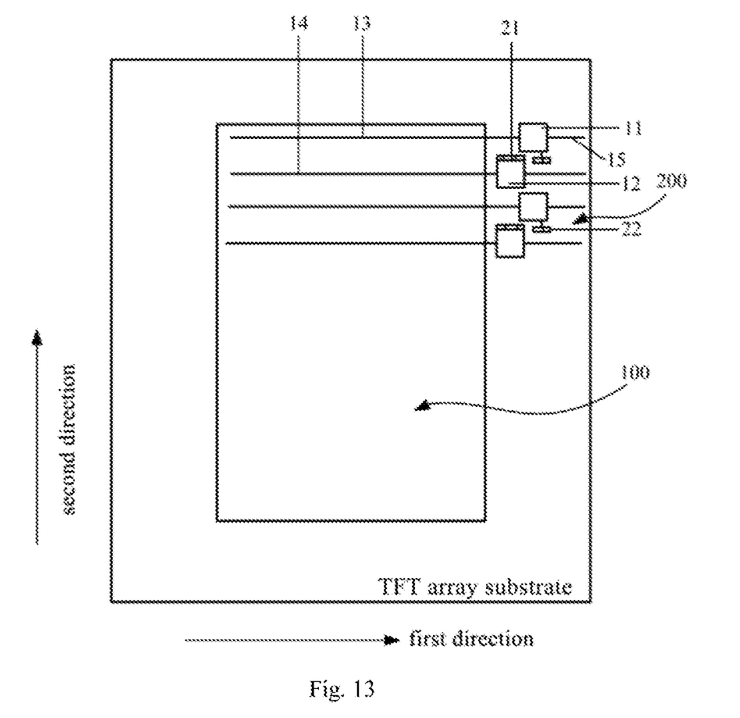
FIG. 13 is another schematic view showing the arrangement of connection pads of an array substrate according to at least one embodiment of the present disclosure.

Further, parts of the first connection pads 11 may fully overlap each other in the first direction (as shown in FIGS. 9 and 10), or parts of the second connection pads 12 may fully overlap each other in the first direction (as shown in FIGS. 9 and 11). In this way, it is able to reduce the coverage width of all connection pads in the first direction, thereby to provide the narrow bezel. It should be appreciated that, all the connection pads may partially overlap each other in the first direction, as shown in FIG. 12.

In a possible embodiment of the present disclosure, as shown in FIG. 9, all the first connection pads 11 in the first connection region 310 in the first direction may fully overlap each other, and all the second connection pads 12 in the second connection region 320 in the first direction may fully overlap each other, so as to minimize the width of all connection pads in the first direction. In addition, because each first connection pad 11 is not overlap, or partially overlaps, the adjacent second connection pad 12, an overlapping area between the two adjacent first connection pads 11 and an overlapping area between the two adjacent second connection pads 12 may increase. As a result, it is able to make full use of the region surrounding the first connection pads 11 and the second connection pads 12, thereby to provide the display device with the narrow bezel.

The repeated contents, e.g., the positions of such structures as the alignment mark 21, the antistatic mechanism 22 and the testing mechanism, the connection modes between the connection pads and the signal lines as well as the leads, and the structure of the connection pad, will not be particularly defined herein.

It should be appreciated that, according to the practical need, for parts of the connection pads, first connection pad 11 does not overlap the adjacent second connection pad 12 in the first direction, and partially overlaps the adjacent second connection pad 12 in the second direction, so as to narrow the bezel at the two adjacent lateral sides of the array substrate. In addition, for the other parts of the connection pads, first connection pad 11 partially overlaps the adjacent second connection pad 12 in the first direction, so as to provide a sufficient large non-wiring region 200 surrounding the first connection pads 11 and the second connection pads 12, thereby to form such structures as the alignment mark 21, the antistatic mechanism 22 and the testing mechanism at the non-wiring region.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An array substrate, comprising a display region and a non-display region, wherein the non-display region comprises a connection region where a plurality of connection pads is arranged, and for at least parts of the plurality of connection pads, two adjacent connection pads are partially overlap each other in a first direction, wherein the non-display region further comprises a sealant region, and the connection region is arranged between the display region and the sealant region.

2. The array substrate according to claim 1, wherein a part of the plurality of connection pads fully overlap each other in the first direction.

3. The array substrate according to claim 2, wherein the plurality of connection pads includes first connection pads and second connection pads, the first connection pads in the first direction fully overlap each other, and the second connection pads in the first direction fully overlap each other.

4. The array substrate according to claim 1, wherein in the case that the two adjacent connection pads are not overlap each other in the first direction, the two adjacent connection pads partially overlap each other in a second direction perpendicular to the first direction.

5. The array substrate according to claim 3, further comprising an antistatic mechanism arranged at a non-wiring region between the two adjacent first connection pads or the two adjacent second connection pads.

6. The array substrate according to claim 3, further comprising an alignment mark arranged at the non-wiring region between the two adjacent first connection pads or the two adjacent second connection pads.

7. The array substrate according to claim 3, further comprising a testing mechanism arranged at the non-wiring region between the two adjacent first connection pads or the two adjacent second connection pads.

8. The array substrate according to claim 1, wherein in the case that the two adjacent connection pads partially overlaps each other in the first direction to form a first overlapping region, a width of the first overlapping region is one-fifth to one-third of a length of a first connection pad, and the length of the first connection pad is a distance between two opposite lateral sides of the first connection pad in a second direction perpendicular to the first direction.

9. The array substrate according to claim 1, further comprising signal lines arranged at the display region and leads arranged at the non-display region, wherein each lead is arranged to apply an electrical signal to a corresponding signal line via the connection pad.

10. An array substrate, comprising:
a display region and a non-display region; and
signal lines arranged at the display region and leads arranged at the non-display region,
wherein the non-display region comprises a connection region where a plurality of connection pads is arranged, and for at least parts of the plurality of connection pads, two adjacent connection pads are partially overlap each other in a first direction,
wherein the leads at least comprise a first lead and a second lead intersecting each other, and the first lead is insulated from the second lead at an intersection,
wherein the first lead comprises a hollowed-out portion at the intersection.

11. The array substrate according to claim 9, wherein the array substrate is a thin film transistor (TFT) array substrate, and the signal lines comprise a first signal line and a second signal line which are both gate lines or both data lines.

12. The array substrate according to claim 11, wherein the first signal line is a gate line or a data line and the second signal line is a common signal line.

13. The array substrate according to claim 9, wherein the first direction is parallel to an extension direction of the signal line.

14. The array substrate according to claim 9, wherein the connection region comprises a first connection region and a second connection region, the connection pads at the first connection region are electrically connected to the signal lines in odd-numbered rows, and the connection pads at the second connection region are electrically connected to the signal lines in the even-numbered rows.

15. The array substrate according to claim 1, wherein a cross section of each connection pad is of a square shape in a direction parallel to a plane where the array substrate is located.

16. A display device comprising the array substrate according to claim 1.

17. An array substrate, comprising a display region and a non-display region,
wherein the non-display region comprises a connection region where a plurality of connection pads is arranged, and for at least parts of the plurality of connection pads, two adjacent connection pads are partially overlap each other in a first direction,
wherein the plurality of connection pads includes first connection pads and second connection pads, the first connection pads in the first direction fully overlap each other, and the second connection pads in the first direction fully overlap each other,
wherein the array substrate further comprises:
an antistatic mechanism arranged at a non-wiring region between the two adjacent first connection pads or the two adjacent second connection pads; or
an alignment mark arranged at the non-wiring region between the two adjacent first connection pads or the two adjacent second connection pads.

18. The array substrate according to claim 10, wherein the first lead and the second lead are connected to each other throng a via-hole.

\* \* \* \* \*